United States Patent [19]

Devin et al.

[11] Patent Number: 4,860,256
[45] Date of Patent: Aug. 22, 1989

[54] INTEGRATED CIRCUIT PROVIDED WITH SWITCHING ELEMENTS FOR CHANGEOVER TO REDUNDANCY ELEMENTS IN A MEMORY

[75] Inventors: Jean Devin, aix en Provence; Philippe Calzi, Bouc Bel Air, both of France

[73] Assignee: SGS-Thomson Microelectronics S.A., Paris, France

[21] Appl. No.: 133,626

[22] Filed: Dec. 16, 1987

[30] Foreign Application Priority Data

Dec. 19, 1986 [FR] France ................ 86 17888

[51] Int. Cl.⁴ .................. G11C 7/00; G11C 11/40
[52] U.S. Cl. .......................... 365/189.03; 365/200
[58] Field of Search ............. 365/96, 189, 200, 201

[56] References Cited

U.S. PATENT DOCUMENTS

| | | | |
|---|---|---|---|
| 4,714,839 | 12/1987 | Chung | 365/96 X |
| 4,720,817 | 1/1988 | Childers | 365/96 X |
| 4,734,885 | 3/1988 | Luich | 365/96 X |

FOREIGN PATENT DOCUMENTS

| | | | |
|---|---|---|---|
| 0029322 | 5/1981 | European Pat. Off. | 365/200 |
| 0098215 | 1/1984 | European Pat. Off. . | |
| 0148510 | 7/1985 | European Pat. Off. . | |
| 0159928 | 10/1985 | European Pat. Off. . | |

OTHER PUBLICATIONS

Hewlett-Packard Journal, vol. 34, No. 8, about 1983, pp. 20-24, Amstelveen NL; J. K. Wheeler et al.: "128K-Bit MMOS Dynamic RAM with Redundancy" p. 23, colonne de droite.

Primary Examiner—Stuart N. Hecker
Assistant Examiner—Alyssa H. Bowler
Attorney, Agent, or Firm—Oblon, Spivak, McClelland, Maier & Neustadt

[57] ABSTRACT

In an integrated circuit provided with a memory including redundancy elements and fuses for switching-over to the redundancy elements, a supplementary terminal for receiving a high voltage is connected to all the fuses and to a circuit which generates low voltage at the time of programming of the memory and which is capable of presenting high impedance when the high voltage is applied, with the result that the entire current flows through the fuses selected for blowout.

4 Claims, 2 Drawing Sheets

FIG_1
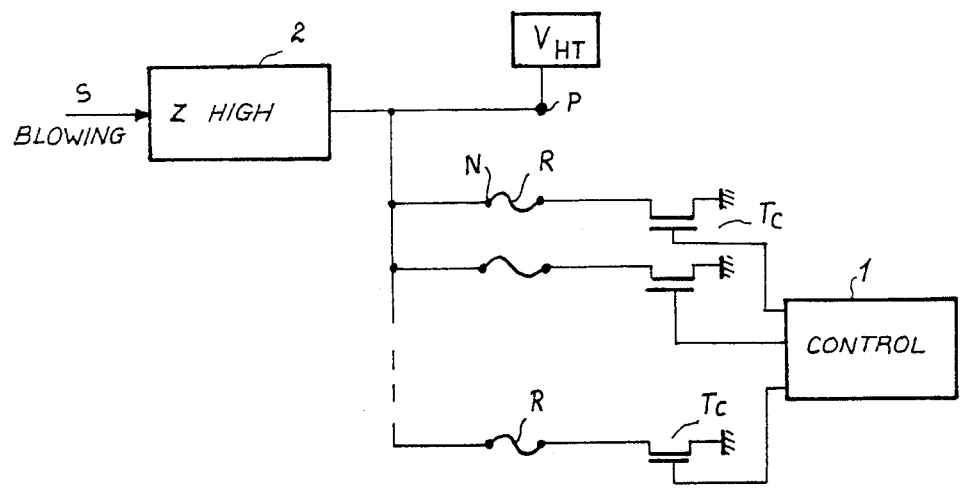
FIG_2
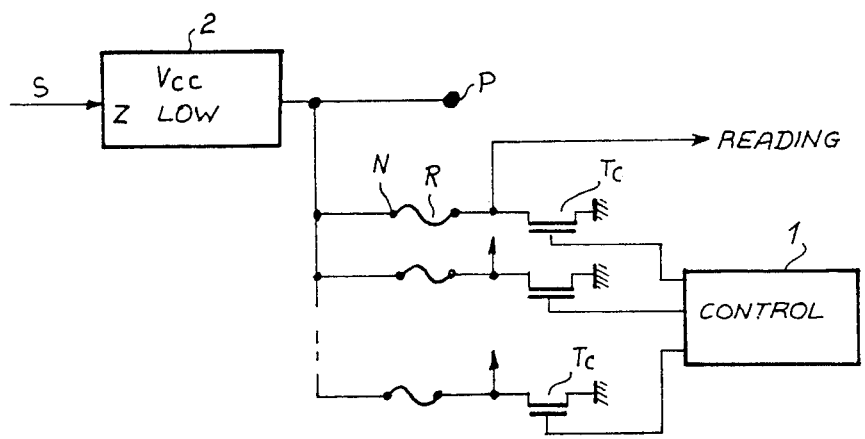

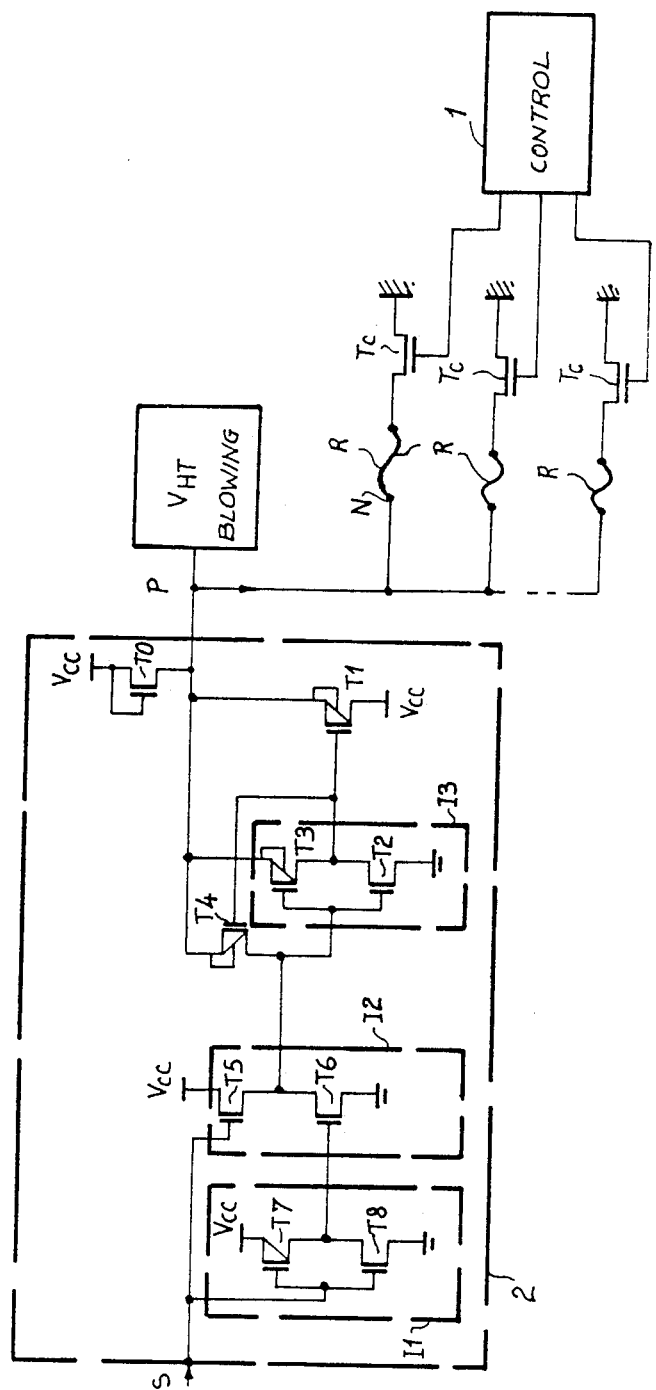
FIG_3

INTEGRATED CIRCUIT PROVIDED WITH SWITCHING ELEMENTS FOR CHANGEOVER TO REDUNDANCY ELEMENTS IN A MEMORY

BACKGROUND OF THE INVENTION

1. Field of the Invention

The present invention relates to integrated circuits which include at least one memory having redundancy elements. The invention is more particularly concerned with elements for switching-over to the redundancy elements of the memory.

2. Description of the Prior Art

Redundancy elements are components which are substituted for faulty elements of the memory. The substitution must be transparent for the memory user. When a user addresses a memory cell and when this cell has proved to be defective at the time of testing, a circuit has memorized this fault condition so as to initiate a change over to the desired redundancy element which is consequently substituted for the defective cell without the user's knowledge. However, in order to perform a switching operation of this type, it is necessary to provide memory cells which are dedicated to storage of information for switching to a predetermined redundancy cell in respect of each faulty cell.

This storage operation takes place at the time of the first memory test when the integrated circuit is mounted on a test board prior to encapsulation. Storage is performed by blowout or non-blowout of fuses provided for this purpose. The desired redundancy element can be addressed by first determining the state of these fuses, this being achieved by measuring the voltage between one terminal and a reference potential.

In circuits of the MOS type, low-value resistors provided in the form of a polycrystalline silicon layer are accordingly "broken-down" by means of a high electric (or laser) discharge at the time of testing of the memory. The polycrystalline silicon layer disappears and the resistor has an infinite impedance. A detection circuit is provided for each fuse in order to determine its state. The disadvantage of this method lies in the need to provide a detection circuit for each fuse.

Furthermore, in order to blow a fuse, it is necessary to supply a high voltage which is not employed in memories as a general rule since the voltages required for the read operation, for example, are between 0 and 5 volts.

The only high voltage available at the present time is the programming voltage Vpp which is selected by the customer. Requisite programming voltages are in the vicinity of 10 to 15 volts. In point of fact, the development of technology is attended by a downward trend in required values of programming voltage. The result is that, when the technology has reached a sufficiently advanced stage of development, it will prove impossible to use any memory programming voltage for blowout of fuses reserved for the switching circuit.

In the present state of the art, it is a customary practice to utilize this programming voltage Vpp for blowing these fuses. To this end, the voltage is applied from a common terminal which is used for programming of the memory and also for fuse blowout when carrying out tests. The fuses are connected directly between the potential Vpp and ground via a control transistor. Blowout of fuses takes place when the transistors are triggered into conduction.

This solution is not without danger. In fact, since the supply voltage is common to fuse blowout and to programming, the fuses which have not blown are liable to receive a potential difference since the control transistors, even if they are not turned-on, are nevertheless put in a conductive state by a punch-through phenomenon which occurs in the presence of a high voltage.

The characteristics of fuses therefore suffer degradation during programming of memories. This aging process eventually leads to an unintentional change in the state of the fuses.

The present invention proposes to overcome the drawbacks outlined in the foregoing and to provide in the integrated circuit of the memory type a supplementary terminal which is connected to all the fuses but is not intended to be connected to the external pins of the integrated circuit. Said supplementary terminal is connected to a circuit which generates a low voltage at the time of programming of the memory and which is capable of presenting high impedance when a high voltage is applied to said supplementary terminal in order to ensure that the entire current flows through the fuses selected for blowout.

SUMMARY OF THE INVENTION

The present invention accordingly relates to an integrated circuit having at least one memory which includes at least one redundancy element and at least one fuse for initiating switchover to a redundancy element, and mainly comprising:

a converter circuit having one input and one output, an operating-mode control signal being applied to the input of said circuit;

a supplementary terminal for receiving a high-voltage supply, the output of the converter circuit being connected to said supplementary terminal and to a terminal of at least one fuse, a high impedance being provided by the converter circuit with respect to the fuse or fuses when the operating-mode control signal is in a first logic state which is present when the high voltage is applied to said supplementary terminal, a low impedance being presented by said converter circuit which is capable of supplying the fuse or fuses at a lower voltage when said supplementary terminal is no longer supplied, in which case the control signal is in a second logic state.

BRIEF DESCRIPTION OF THE DRAWINGS

FIG. 1 is a general diagram of the invention in accordance with the fuse-blowout mode.

FIG. 2 is a general diagram of the invention in the read mode.

FIG. 3 illustrates an exemplified embodiment of the invention.

DETAILED DESCRIPTION OF THE INVENTION

The general diagram of FIG. 1 shows the blow-out circuit in accordance with the invention at the time of fuse blowout which takes place during integrated circuit tests.

The general diagram of FIG. 2 illustrates this circuit at the time of operation of the integrated circuit when not on test.

During the integrated-circuit tests, programming is carried out on memory elements which are reserved for storage of switchover to a predetermined redundancy memory element. These memory elements are each constituted by a fuse R connected to a control transistor Tc. Each transistor Tc is connected to a circuit 1 having the function of controlling the conduction of the desired transistor Tc. The gate of each transistor Tc is connected to the control circuit 1, one of the other two main electrodes is connected to ground whilst the other electrode is connected to one terminal of a fuse R. The second terminal N of each fuse R is connected on the one hand to a terminal P and on the other hand to a converter circuit 2 which receives an order S representing the operating mode of the integrated circuit. This operating mode is either the blowout mode or the normal mode of reading of the state of the fuses at each memory-addressing operation.

The terminal P is a supplementary terminal which is provided for the purpose of testing the integrated circuit but which is not intended to be connected to the external pins of this circuit.

The supplementary terminal P just mentioned is intended to receive a high voltage V at the time of performance of tests, this voltage being directly applied to the fuses and being of sufficient value to produce blowout of the fuses R (V=15 to 20 volts, for example).

The converter circuit 2 makes it possible according to the logic state of the control signal to provide high impedance from the supplementary terminal. Thus no useful current for blowout is diverted to said circuit 2 at the time of application of the high voltage V. The fuses connected to conducting transistors Tc are thus caused to blow.

After blowout of the appropriate fuses, the high voltage V is withdrawn and the supplementary terminal is in the "floating" condition. The logic state of the control signal is modified so that the circuit accordingly behaves as a generator which delivers a low voltage Vcc and provides low impedance from the fuse circuit. The low voltage Vcc is of sufficient value (5 volts, for example) to permit reading of the state of each fuse, this read operation being carried out in a manner which is already known per se.

FIG. 3 illustrates a particular embodiment of the invention.

It will be assumed by way of example that the top level of voltage supply to the MOS transistors of the circuit is the voltage Vcc at 5 V and that the bottom level is 0 V.

The converter circuit 2 is composed in the first place of three series-connected inverters $I_1$, $I_2$, $I_3$. The first inverter $I_1$ includes a p-channel MOS transistor T7, the source of which is connected to the voltage Vcc and the drain of which is connected to the drain of an n-channel MOS transistor T8. The source of transistor T8 is connected to ground (0 V). The gates of the two transistors receive the control signal S, the voltage level of which is either Vcc or ground, depending on the desired operating mode. The second inverter $I_2$ includes two n-channel MOS transistors T5 and T6. The drains of these transistors are connected to each other, the source of transistor T6 is connected to ground, the source of transistor T5 is at the potential Vcc. The gate of transistor T5 is controlled by the signal S. The gate of transistor T6 is controlled by the output of the inverter $I_1$.

The output of the inverter $I_2$ is taken from the common node of the two drains. This output controls the gate of two other transistors T3 and T2 which are mounted so as to form the third inverter $I_3$. The transistor T3 is a p-channel MOS transistor and the transistor T2 is an n-channel MOS transistor. The source of transistor T2 is connected to ground, the source of transistor T3 is either at the potential V of 20 volts when the voltage V is applied or at the potential Vcc when this is not the case.

The output of said inverter controls the gate of a p-channel MOS transistor T4, the source of which is connected either to the potential V (20 volts) or to the potential Vcc (5 volts), depending on whether the voltage V is applied to the supplementary terminal or not. The drain of said transistor is connected to the output of the inverter $I_2$. A p-channel MOS transistor is controlled by the output of the inverter $I_3$ whilst the drain of said transistor is at the potential Vcc and its source is at the potential V or Vcc.

An n-channel MOS transistor T0 is controlled by the voltage Vcc which is applied to its source. The drain of said transistor is at the potential V or Vcc.

The operation of the converter circuit 2 is as follows:

In order to produce blowout of fuses, the signal S is at zero volt and the 20-volt potential is applied to the supplementary terminal P. Transistor T8 is in the nonconducting or "off" state and transistor T7 is in the conducting or "on" state. Transistor T6 is in the "on" state and transistor T5 is "off". Transistor T2 is "off" and transistor T3 is "on". Transistor T3 supplies the voltage V (20 volts) to the gate of transistor T1 which is thus caused to cut-off. Transistor T3 supplies this voltage of 20 V to the gate of transistor T4 which is also caused to cut-off. There is then no longer any current path for diverting the fuse current.

For the normal "read" operation, the signal S is at the potential Vcc (5 volts) and the supplementary terminal is in the floating condition (no voltage is applied).

Transistor T8 is in the "on" state and transistor T7 is in the "off" state. Transistor T6 is "off" and transistor T5 is "on". Transistor T2 is "on" and transistor T3 is "off". Transistor T4 then tends to become conductive and to create a current path T0, T4, T2 with three conductive transistors in series. A potential Vcc−Vg tends to be established on the supplementary terminal. However, transistor T1 has zero voltage on its gate and is therefore in the conducting state, its drain is connected to Vcc and its source then restores Vcc to the supplementary terminal, whereupon transistor T0 no longer serves any useful purpose. This transistor T0 in fact makes it possible to initiate suitable biasing of the transistors T4 and T3, whereupon transistors T4 and T3 are correctly supplied with the voltage Vcc and the supplementary terminal is at the potential Vcc, thus making it possible to read the state of the fuses without giving rise to premature aging.

This particular example of construction offers the advantage of obtaining a direct relationship between the blowout voltage V and the fuses, positioning of this voltage being carried out without passing through a series resistor.

In contrast to the prior art, the switching circuit in accordance with the invention therefore makes it possible to dissociate memory-programming operations from fuse-blowout operations.

What is claimed is:

1. An integrated circuit having at least one memory which includes at least one redundancy element and at least one electrically fusable fuse for initrating switchover from a failing memory element to a redundancy element, comprising:
   an internal pad contact which is insulated from any external pin of said integrated circuit, said internal pad contact receiving a high voltage supply and said pad contact being connected to said at least one fuse; and a converter circuit having one input for receiving an operating mode control signal and an output connected to said internal pad wherein said converter circuit provides a high output impedance when simultaneously both said mode control signal is in a first logic state and said high voltage supply is applied to said internal pad contact and wherein said converter supplies a low supply voltage at a low impedance when simultaneously both said mode control signal is in a second logic state and said internal pad is not supplied with said high voltage supply.

2. An integrated circuit according to claim 1, wherein the converter circuit includes first, second and third inverters in series, the first inverter being given by the control signal, the third inverter being intended to drive the gate of a first and a second p-channel MOS transistor in which the drains constituting the output of the converter circuit receive either the high voltage when the control signal has a first predetermined state which causes said transistors to cutoff and prevents any diversion of the fuse current through the circuit or else a voltage of sufficient value to initiate a current path which puts these two transistors in the conducting state, with the result that the second transistor restores the low voltage at its drain or at the output of said converter circuit.

3. An integrated circuit according to claim 2, wherein the first and third inverters include an n-channel transistor and a p-channel transistor and wherein the second inverter includes two n-channel transistors.

4. An integrated circuit according to claim 3, wherein:

the gates of the two transistors of the first inverter are driven by the control signal and the drains of said transistors drive the gates of one transistor of the second inverter, the gate of the other transistor being driven by said control signal, and wherein:

the drain and the source of the transistors of the second inverter drive the gates of the transistors of the third inverter, the drains of these two transistors drive the gate of the second transistor and the gate of the first transistor;

the drain of a third n-channel MOS transistor is connected to the drains of the first and second transistors, a function of said third transistor being to initiate biasing of the first transistor and of the p-channel MOS transistor of the third inverter.

* * * * *